(12) United States Patent
Kelkar

(10) Patent No.: US 9,425,736 B2
(45) Date of Patent: Aug. 23, 2016

(54) VARIABLE CAPACITOR STRUCTURE

(71) Applicant: INTERNATIONAL BUSINESS MACHINES CORPORATION, Armonk, NY (US)

(72) Inventor: Ram Kelkar, South Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 22 days.

(21) Appl. No.: 14/146,246

(22) Filed: Jan. 2, 2014

(65) Prior Publication Data

US 2015/0188490 A1 Jul. 2, 2015

(51) Int. Cl.
| | |
|---|---|
| *H03B 5/12* | (2006.01) |
| *H03B 5/36* | (2006.01) |
| *H03B 1/00* | (2006.01) |

(52) U.S. Cl.
CPC ............... *H03B 5/1228* (2013.01); *H03B 1/00* (2013.01); *H03B 5/124* (2013.01); *H03B 5/1246* (2013.01); *H03B 5/36* (2013.01); *H03B 5/364* (2013.01); *H03B 2201/0208* (2013.01)

(58) Field of Classification Search
CPC .......... H03B 1/00; H03B 5/364; H03B 5/124; H03B 5/36; H03B 5/1246
USPC ........... 331/167, 177 V, 117 R, 117 FE, 36 C, 331/179
See application file for complete search history.

(56) References Cited

U.S. PATENT DOCUMENTS

| | | | |
|---|---|---|---|
| 5,625,325 A | 4/1997 | Rotzoll et al. | |
| 6,013,958 A | 1/2000 | Aytur | |
| 6,091,304 A | 7/2000 | Harrer | |
| 6,753,738 B1 | 6/2004 | Baird | |
| 6,774,736 B1 | 8/2004 | Kwek et al. | |
| 6,826,299 B2 | 11/2004 | Brown et al. | |
| 7,042,253 B2 | 5/2006 | Su et al. | |
| 7,113,052 B2 | 9/2006 | Dunworth | |
| 7,183,866 B2 | 2/2007 | Yang et al. | |
| 7,183,870 B2 | 2/2007 | Takagi | |
| 7,230,505 B2 | 6/2007 | Rachedine et al. | |
| 7,268,630 B2 * | 9/2007 | Rhee et al. ...................... | 331/16 |
| 7,301,411 B2 | 11/2007 | Li Puma et al. | |
| 7,394,329 B2 * | 7/2008 | Vancorenland et al. ... | 331/177 V |
| 7,421,252 B2 | 9/2008 | Kirschenmann et al. | |
| 7,432,768 B2 * | 10/2008 | Han et al. ........................ | 331/16 |
| 7,772,934 B2 | 8/2010 | Vancorenland et al. | |
| 8,183,948 B2 | 5/2012 | Ainspan et al. | |
| 8,253,506 B2 | 8/2012 | Liu et al. | |

(Continued)

OTHER PUBLICATIONS

Lou, et al., "A 0.68-1.65GHz CMOS LC Voltage-Controlled Oscillator with Small VCO-Gain and Step Variation," International Symposium on Integrated Circuits, 2011, abstract.

(Continued)

*Primary Examiner* — Arnold Kinkead
(74) *Attorney, Agent, or Firm* — Steven Meyers; Robert Mlotkowski Safran & Cole, P.C.

(57) ABSTRACT

Variable capacitor structures and methods of use are disclosed. The variable capacitor structures include a variable controlled oscillator which includes a variable capacitor structure having at least one capacitor set driven by a control gate voltage of a voltage control circuit which comprises a logic cell that senses a selected frequency band and sets the control gate voltage based on the selected frequency band.

20 Claims, 6 Drawing Sheets

(56) References Cited

U.S. PATENT DOCUMENTS

| | | | |
|---|---|---|---|
| 8,407,508 B2 | 3/2013 | Lee et al. | |
| 2002/0135428 A1 | 9/2002 | Gomez | |
| 2007/0188255 A1* | 8/2007 | Strandberg | 331/177 V |
| 2011/0316595 A1* | 12/2011 | Bolton | 327/156 |
| 2012/0286888 A1 | 11/2012 | Hsieh et al. | |

OTHER PUBLICATIONS

Mandal, et al., "Implementation of CMOS Low-power Integer-N Frequency Synthesizer for SOC Design, "Journal of Computers, vol. 3, No. 4, Apr. 2008, 8 pages.

Svelto, et al., "1.3 GHz low-phase noise fully tunable CMOS LC VCO," IEEE Journal on Solid State Circuits, 2000, abstract.

Lin, et al., "Integrated Low-power Communication System Design for Wireless Sensor Networks," IEEE Communications Society, 2004, abstract.

Mira, et al., "Distributed MOS Varactor Biasing for VCO Gain Equalization in 0.13 μm CMOS Technology," Radio Frequency Integrated Circuits (RFIC) Symposium, 2004, abstract.

Shin, et al., "3.48 mW 2.4 GHz Range Frequency Synthesizer Architecture With Two-point Channel Control for Fast Settling Performance," IEEE International SOC Conference, 2005, abstract.

Tang et al., "Oscillator Design Efficiency: a New Figure of Merit for Oscillator Benchmarking," IEEE International Symposium on Circuits and Systems, 2000, abstract.

Mandal, et al., "Analog Integrated Circuits and Signal Processing," Unknown, 2010, abstract.

* cited by examiner

VARIABLE CAPACITOR STRUCTURE

FIELD OF THE INVENTION

The invention relates to semiconductor structures and, more particularly, to variable capacitor structures and method of use.

BACKGROUND

Variable controlled oscillators (VCO) are categorized into two groups based on the type of waveform produced: harmonic oscillators and relaxation oscillators. Harmonic oscillators generate a sinusoidal waveform; whereas, relaxation oscillators generate a sawtooth or triangular waveform.

Harmonic oscillators usually consist of a resonator with an amplifier that replaces the resonator losses (to prevent the amplitude from decaying) and isolates the resonator from the output (so the load does not affect the resonator). Some examples of harmonic oscillators are LC-tank oscillators and crystal oscillators. Relaxation oscillators, on the other hand, are commonly used in monolithic integrated circuits (ICs) and can provide a wide range of operational frequencies with a minimal number of external components. Relaxation VCOs are tunable over a wider range of frequencies than harmonic oscillators.

A voltage-controlled capacitor is one method of making an LC oscillator vary its frequency in response to a control voltage. An LC circuit is known as a resonant circuit, tank circuit, or tuned circuit. These types of circuits comprise an inductor and a capacitor connected together so that they can act as an electrical resonator, which stores energy oscillating at the circuit's resonant frequency. LC circuits are typically used for generating signals at a particular frequency, or picking out a signal at a particular frequency from a more complex signal. LC circuits are an important component in many electronic devices, particularly cellular applications, used in circuits such as oscillators, filters, tuners and frequency mixers.

A conventional variable capacitor structure used in an LC tank VCO is shown in FIG. 1. As shown in this representation, four capacitors are individually controlled by each respective control bit b<3:0>. For example, each capacitor is individually set when control bits b<3:0> are set to either low capacitance (b<3:0>=1) or high capacitance (b<3:0>=0). The capacitors controlled by control bits b<3:0> are typically referred to as coarse tune capacitors and the capacitors controlled by the filter are called the fine tune capacitors. The voltages at nodes vfp and vfn, which are provided from a differential filter used in a pll loop, are used to control the fine tune capacitors. The coarse tune capacitors set the VCO frequency band and as the differential filter voltage changes the VCO frequency changes within the selected frequency band. With four coarse tune capacitors it can be seen that a total of 16 frequency bands are achieved.

FIG. 2 shows a typical VCO frequency variation with differential filter voltage for the design shown in FIG. 1. By way of explanation, the differential filter voltage is defined as: voltage at vfp−voltage at vfn. In the conventional design, the vfp voltage varies from 0.1V to 0.9V (for a supply voltage of 1V) and vfn voltage varies from 0.9V to 0.1V. The VCO gain, defined as the change in frequency for a given change in control voltage, changes with the frequency band as can be seen in FIG. 2.

The VCO gain changes more at the higher frequency bands, with frequency band 15 showing the most variation. This is because at the higher frequency band, the total capacitance is reduced (by controlling the coarse tune capacitors) so the fine tune capacitors have more effect. The gain is the slope of the curves shown in FIG. 2.

The gains are found to be:
   at middle of frequency band:
      frequency band 0: gain~1.5 Ghz/V
      frequency band 15: gain~3.0 Ghz/V
   at top of frequency band:
      frequency band 0: gain~1.0 Ghz/V
      frequency band 15: gain~2.0 GHz/V.

These considerable gain changes make it more difficult to maintain the pll loop bandwidth. For example, if the VCO gain changes by a factor of 2, the loop bandwidth will change by the same factor. For applications such as Peripheral Component Interface Express (PCIE), where the pll loop bandwidth needs to be tightly controlled, the VCO gain variation poses a serious challenge and makes it more difficult to meet desired specifications.

SUMMARY

In an aspect of the invention, a variable controlled oscillator comprises a variable capacitor structure having at least one capacitor set driven by a control gate voltage of a voltage control circuit which comprises a logic cell that senses a selected frequency band and sets the control gate voltage based on the selected frequency band.

In an aspect of the invention, a variable capacitor structure comprises a first variable capacitor configuration having a binary weighted array of capacitor segments, where each of the capacitor segments is enabled by one of a plurality of binary control bits. The variable capacitor structure further comprises a second variable capacitor configuration having a capacitance controlled by a first analog control voltage provided by a phase-locked loop. The variable capacitor structure further comprises a third variable capacitor configuration having a capacitance controlled by a control voltage which is determined by a sensed frequency band.

In an aspect of the invention, a method for equalizing gain of a voltage controlled oscillator over a plurality of frequency frequency bands comprises: determining a frequency band; selecting a control voltage based on the determined frequency band; and applying the control voltage to a variable capacitor.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the LC tank variable controlled oscillator (VCO) with gain control, which comprises the structures of the present invention. In still further embodiments, a method in a computer-aided design system is provided for generating a functional design model of the LC tank variable controlled oscillator (VCO) with gain control. The method comprises generating a functional representation of the structural elements of the LC tank variable controlled oscillator (VCO) with gain control.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to variable capacitor structures and methods of use. More specifically, the present invention is directed to variable capacitor structures for use in an LC-tuned voltage controlled oscillator. In more specific embodiments, the present invention is directed to an LC tank variable controlled oscillator (VCO) with gain control that advantageously results in lower gain variation at higher frequency bands, e.g., frequency bands 9-15. The present invention is also directed to a method for equalizing the gain of a VCO over a plurality of frequency bands, which are controlled by a plurality of binary control bits.

Advantageously, the present invention provides a method and structure to shape the VCO gain. This method and structure is flexible in that gain control can be applied to any of the VCO frequency bands. The extent of the gain shaping can also be changed by selecting the sizes of catch diodes as described in more detail herein. In turn, the gain shaping reduces the gain variation across frequency bands which helps meet stringent loop bandwidth requirements in applications such as PCIE.

In embodiments, a structure is provided such that VCO gain is controlled in order to reduce gain variation. By way of specific example, the present invention provides a variable capacitor structure modified by adding a set of capacitors. In embodiments, the variable capacitor structure comprises a first variable capacitor configured as a binary weighted array of capacitor segments, where each of the capacitor segments are enabled by one of a plurality of binary control bits. A second variable capacitor has a capacitance controlled by a first analog control voltage provided by a phase-locked loop. A third variable capacitor has a capacitance controlled by a second analog control voltage which is determined by a digital-to-analog converter whose digital inputs are the plurality of binary control bits enabling the segments of the first variable capacitor, and by the first analog control voltage. The second analog control voltage is a voltage developed from a gate to source of a FET (e.g., MOS FET) having a plurality of equal size gate fingers, each of the gate fingers being enabled by one of the plurality of binary control bits.

Figure 3:
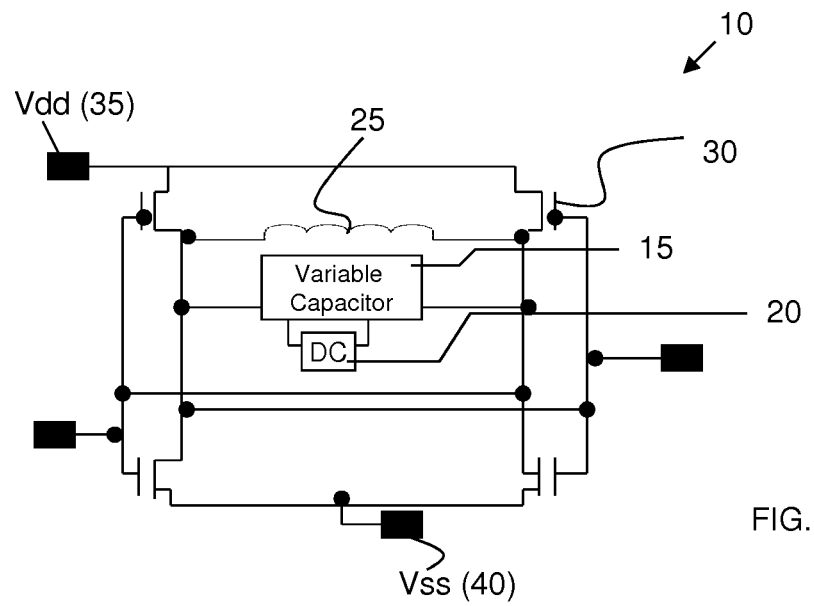
FIG. 3 shows an LC tank VCO in accordance with aspects of the present invention.

FIG. 3 shows an LC tank VCO in accordance with aspects of the present invention. In embodiments, the LC tank VCO 10 shows a variable capacitor structure 15 connected to a differential control 20. The LC tank VCO 10 further shows features such as, for example, a fixed inductor 25 positioned between sets of capacitors 30. Vdd 35 provides supply voltage to the structure shown in FIG. 3, and Vss 40 is ground.

Figure 4:
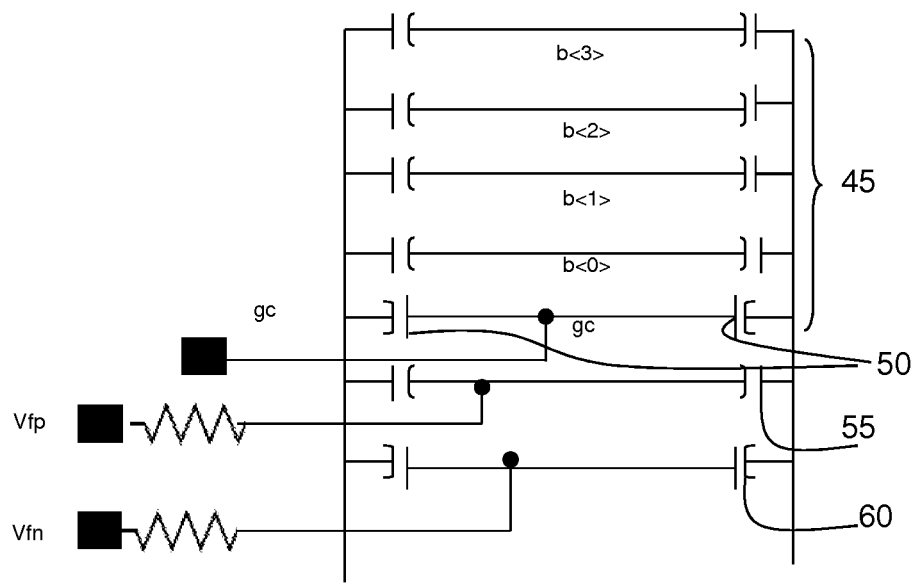
FIG. 4 shows a variable capacitor structure used in the LC tank VCO of FIG. 3, in accordance with aspects of the present invention.

FIG. 4 shows a variable capacitor structure 15 used in the LC tank VCO 10 of FIG. 3, in accordance with aspects of the present invention. In embodiments, the variable capacitor structure 15 includes four sets of capacitors 45 controlled by respective control bits b<3:0>, and capacitors 55 and 60 controlled by the filter (vfp and Vfn). The capacitors controlled by control bits b<3:0> are referred to as coarse tune capacitors and the capacitors 55 and 60 controlled by the voltages provided from the filter are referred to as the fine tune capacitors. It should thus be understood by those of skill in the art that the capacitors 45 are a first variable capacitor configuration structured as a binary weighted array of capacitor segments, where each of the capacitor segments are enabled by one of a plurality of binary control bits. The capacitors 55 and 60 are a second variable capacitor configuration having a capacitance controlled by a first analog control voltage (vfp and vfn) provided by a phase-locked loop (pll). Accordingly, the nodes vfp and vfn are from a differential filter used in a pll loop, used to control the fine tune capacitors 55 and 60.

The variable capacitor structure 15 further includes a set of capacitors 50 controlled by a voltage of the input node gc. That is, the set of capacitors 50 are a third variable capacitor configuration having a capacitance controlled by an analog control voltage (voltage at node gc) whose inputs are the plurality of binary control bits enabling the segments of the first variable capacitor, and by the first analog control voltage. In embodiments, the capacitance size of the capacitors 50 is a design parameter that depends on the VCO.

In operation, the control voltage at node gc is held at ground (gnd) for the lower frequency bands, e.g., frequency bands 0-8. In this way, the capacitance of these capacitors is at the lowest thereby not affecting the lower frequency bands (e.g., frequency bands 0-8 as an illustrative example). On the other hand, if the external band control selects a higher frequency band, e.g., frequency bands 9-15, the control voltage at node gc is increased which, in turn, increases the capacitance. In this way, the frequency can be changed. The control voltage at node gc is thus a function of the selected frequency band: for lower frequency bands the control voltage at node gc is set to gnd and for the higher frequency bands the control voltage at node gc changes which, in turn, affects frequency. In embodiments, the differential filter voltage vfp, which can vary from 0.1V to 0.9V, is used to create the voltage at node gc as described herein.

Figure 5:
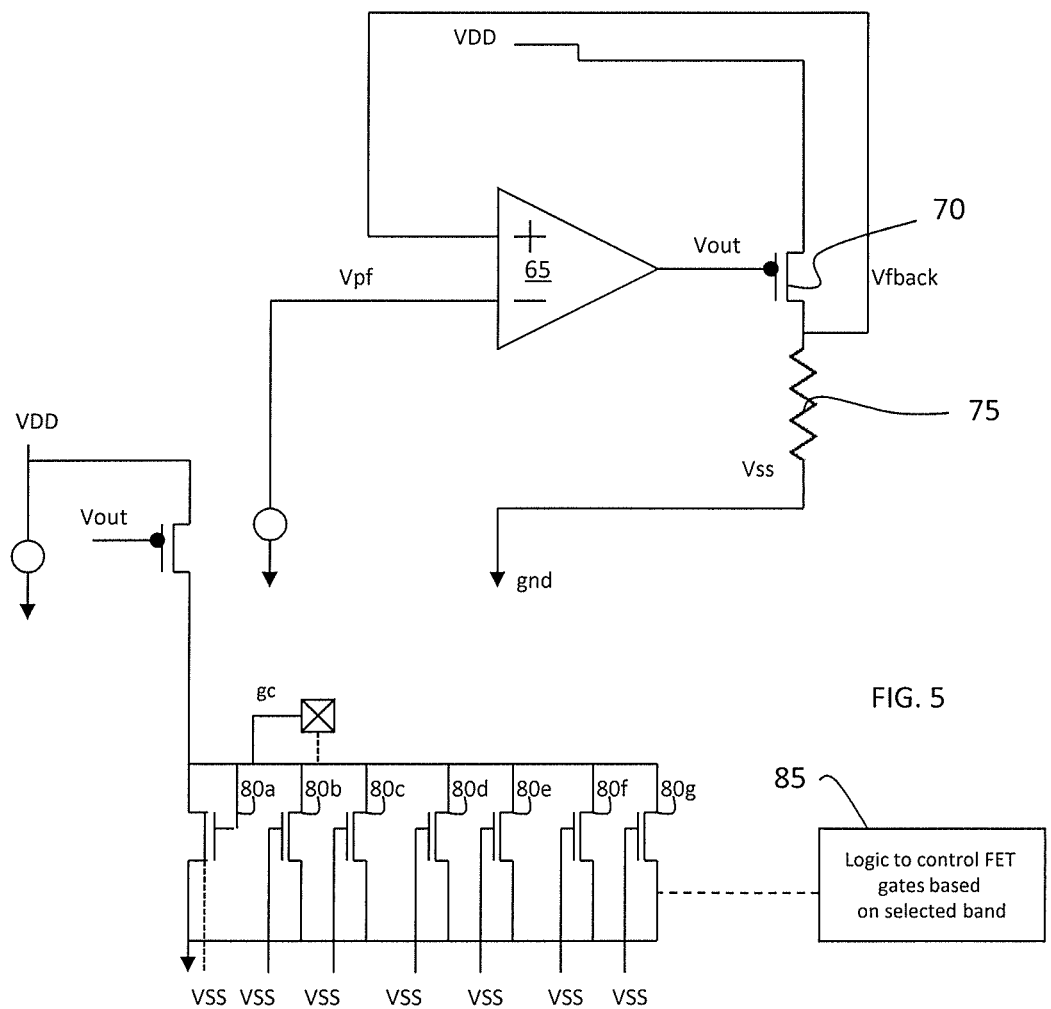
FIG. 5 shows a control circuit in accordance with aspects of the present invention.

FIG. 5 shows a representation of the voltage control circuit 20 shown in FIG. 3. In this embodiment, the voltage control circuit 20 includes an opamp 65 which controls a pfet 70. The current of the pfet 70 creates a voltage across a resistor 75. The resistor voltage Vfback is fed back to the opamp 65 to convert the voltage vfp to a current. This current is mirrored over and fed into diode connected FETs 80a-80g to create the control voltage at node gc. The diode connected FETs 80a-80g can include equal sized gate fingers, which correspond to frequency bands 9 through 15 of a VCO, e.g., the LC tank VCO 10 of FIG. 3. A logic cell 85 senses the selected frequency band and sets the control voltages though manipulation of the diode connected FETs 80a-80g as described herein.

As shown in FIG. 5, the diode connected FETs 80a-80g are controlled by the logic cell 85. Specifically, for each frequency band 9-15, the logic cell 85 will select certain of the diode connected FETs 80a-80g to be coupled to ground and/or voltage node gc, in order to affect the control voltage and, hence change frequency in certain bands. For example, for operation in frequency band 15, six diode connected FETs 80b-80g are connected to gnd (Vss) which results in the control voltage at node gc being in its highest state. On the other hand, for frequency band 9, the diode connected FETs 80b-80g are all connected to node gc which results in the control voltage being in its lowest state.

For frequency bands between 9 and 15 selected diode connected FETs 80a-80g are connected to gnd and to node gc in order to adjust the voltage and hence the gain ratio. For frequency band 10, on the other hand, five of the six diode connected FETs 80b-80f are tied to node gc and the sixth diode connected FET 80g is tied to gnd. For frequency band 11, two gates of the six FETs (e.g., diode connected FETs 80b-80c) are tied to node gc and the remaining FETs (e.g., diode connected FET 80d-80g) are tied to gnd. The control voltage at node gc is thus a function of the vfp voltage as well as the selected frequency band. The result is that the present invention is capable of creating a customized control voltage that is based on the selected frequency band as well as the VCO operating point (the voltage at vfp). In this way, as a result of changing the control voltage at node gc, the VCO frequency characteristics change in the higher frequency bands.

Figure 1:
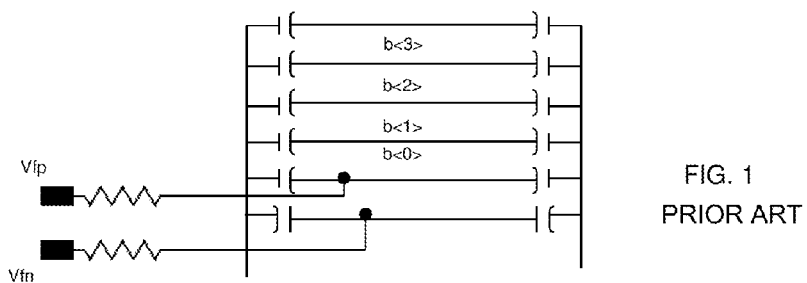
FIG. 1 shows a conventional variable capacitor structure used in an LC tank VCO.
Figure 2:
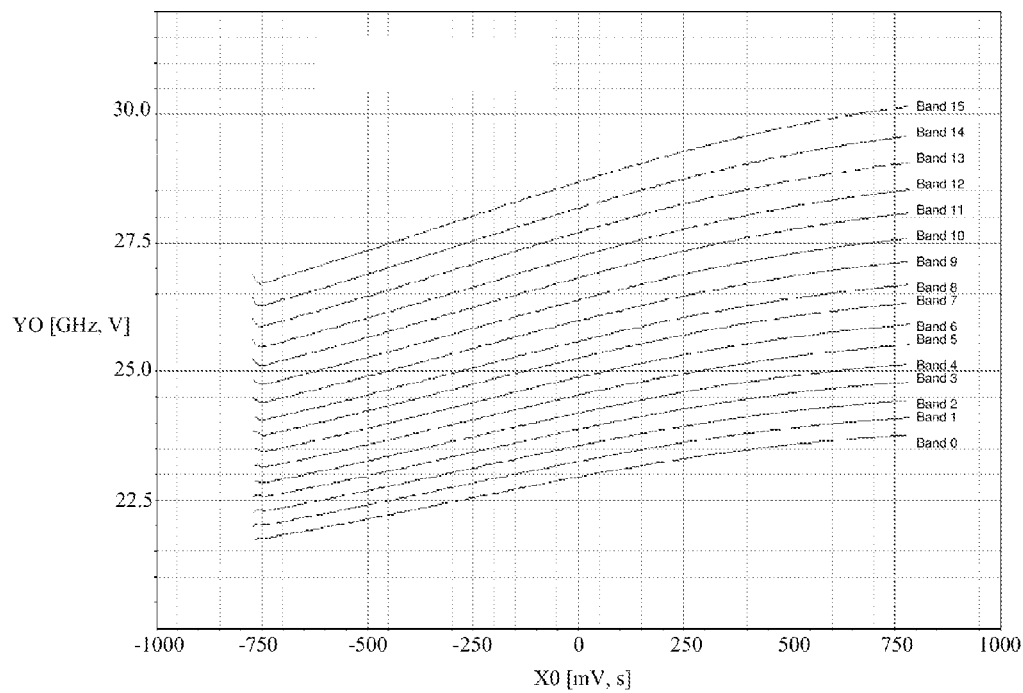
FIG. 2 shows a VCO frequency variation with differential filter voltage for the design shown in FIG. 1.
Figure 6:
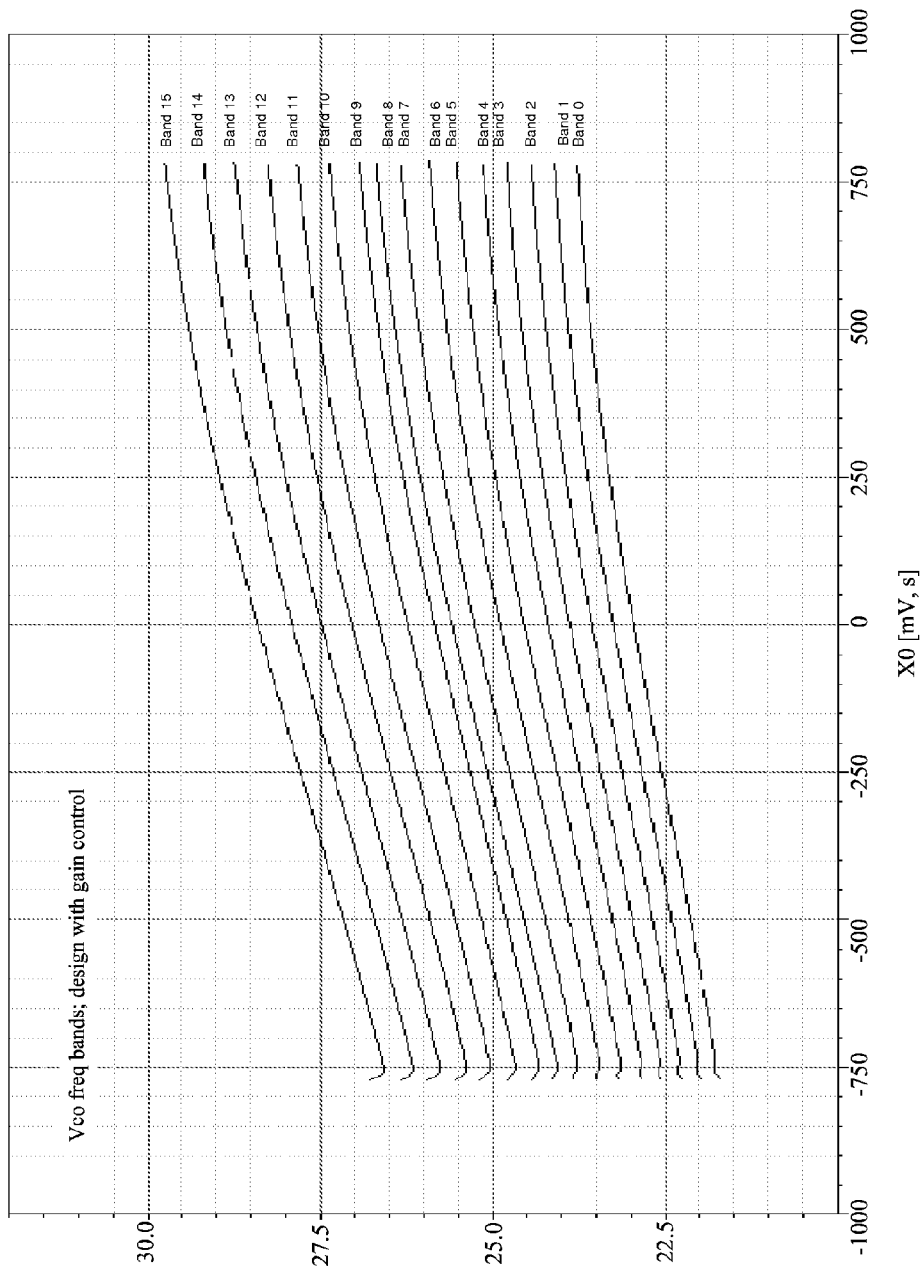
FIG. 6 shows VCO frequency variation with gain control in accordance with aspects of the present invention.

FIG. 6 shows VCO frequency variation with gain control in accordance with aspects of the present invention. In FIG. 6, the VCO frequency for frequency bands 0 thru 8 are the same as shown in FIG. 2, since in these lower frequency bands the node gc is held at gnd and the added capacitance is the lowest. However, the VCO frequency characteristics change starting from frequency band 9 and the effect of the gain control in shaping the characteristic increases as the frequency bands increase. Frequency band 15 is the most affected as can be seen compared to FIG. 2, with the maximum frequency in frequency band 15 being less than 30 GHz compared to 30 GHz in FIG. 2.

Figure 7:
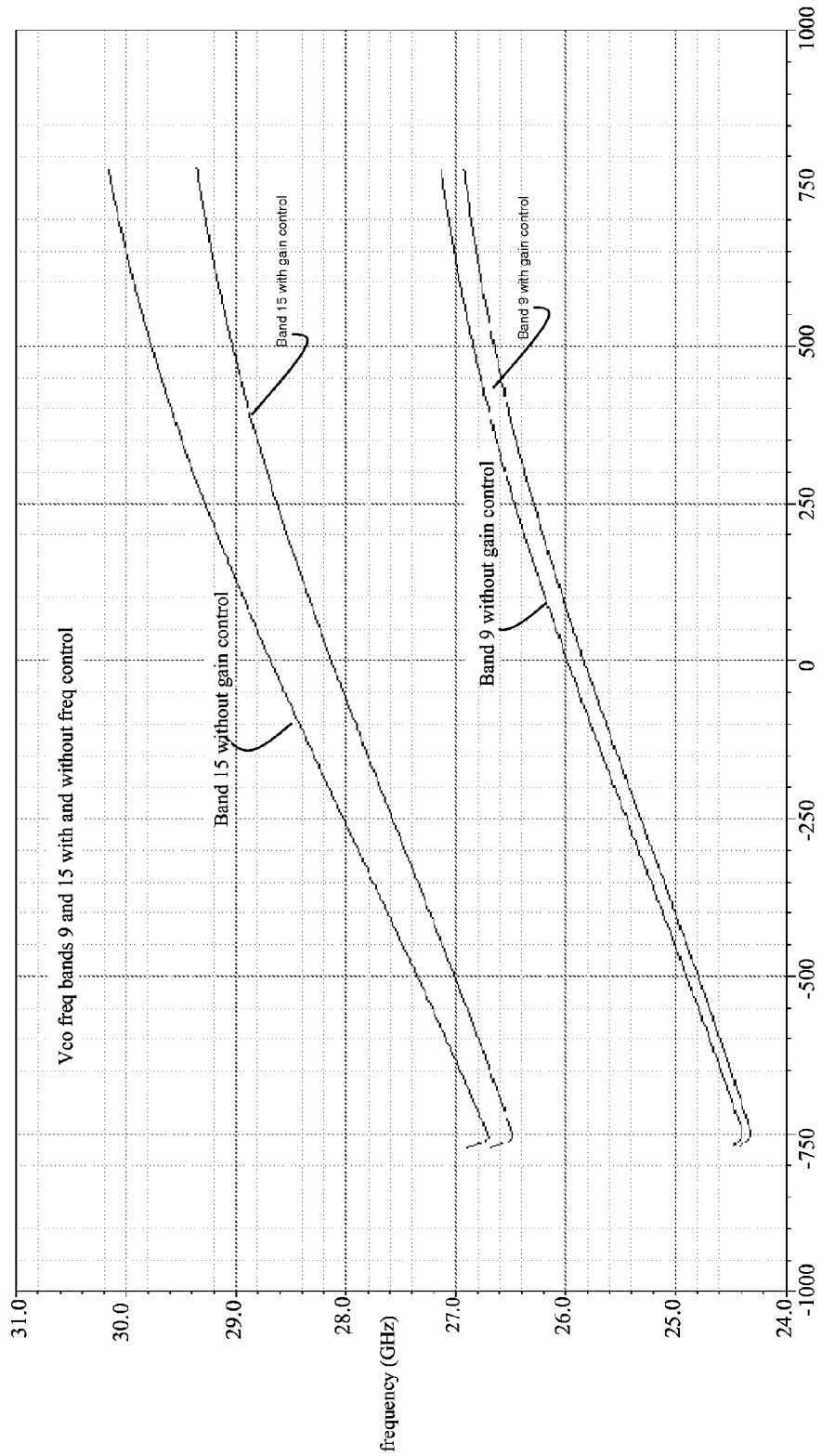
FIG. 7 shows a comparison of VCO frequency variation for frequency bands 9 and 15 with and without gain control.

FIG. 7 shows a comparison of the frequencies of frequency bands 9 and 15 with and without the gain control circuit of the present invention. As seen in this representation, the frequency in frequency band 9 is changed slightly while frequency in frequency band 15 sees more change. Specifically, it is shown that the VCO gain is reduced in frequency band 15, both at the middle of the frequency band as well as at the top of the frequency band (when implemented with the gain control circuit of the present invention). For example, with gain control of the present invention, the new gains for frequency band 15 are approximately 20% lower at the middle of the frequency band and about 30% lower at the top of the frequency band. This results in reducing the VCO gain variation from 2:1 to 1.6:1 at the middle of the frequency band and to 1.4:1 at the top of the frequency band. By shaping the control voltage at node gc as well as selecting the size of the added capacitors in FIG. 4 it is possible to shape the VCO gain curves to a desired gain. It is also possible to shape the gain in more frequency bands than the seven frequency bands described herein.

Advantageously, the present invention provides a method and structure to shape the VCO gain. This method and structure is flexible in that gain control can be applied to any of the VCO frequency bands. The extent of the gain shaping can also be changed by selecting the sizes of catch diodes as described herein. As should be understood by those of skill in the art, the gain shaping reduces the gain variation across frequency bands which helps meet stringent loop bandwidth requirements in applications such as PCIE.

The structures of the present invention can be manufactured in a number of ways using a number of different tools. In general, though, the methodologies and tools are used to form small structures with dimensions in the micrometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 8:
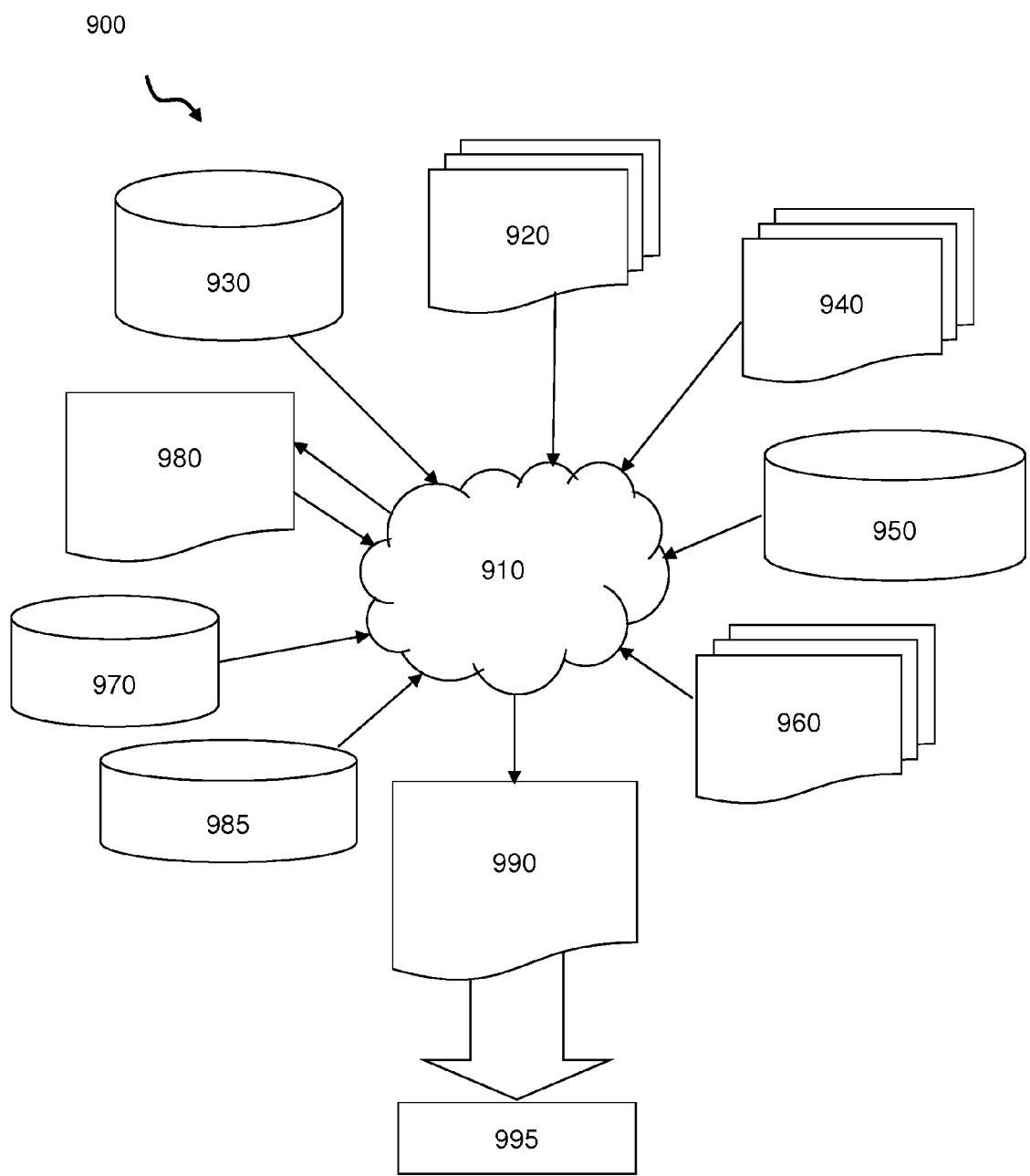
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-5. In one embodiment, design structure 990 may comprise a compiled, executable HDL simulation model that functionally simulates the devices shown in FIGS. 3-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-5. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A variable controlled oscillator comprising a variable capacitor structure having at least one capacitor set driven by a control gate voltage of a voltage control circuit which comprises a logic cell that senses a selected frequency band and sets the control gate voltage based on the selected frequency band,
   wherein the logic cell is structured to select certain diode connected field effect transistors (FETs) to be coupled to one of a ground and a voltage node, in order to affect the control gate voltage and, hence change frequency in certain bands.

2. The variable controlled oscillator of claim 1, wherein the variable capacitor structure comprises coarse tune capacitors and fine tune capacitors.

3. A variable controlled oscillator comprising a variable capacitor structure having at least one capacitor set driven by a control gate voltage of a voltage control circuit which comprises a logic cell that senses a selected frequency band and sets the control gate voltage based on the selected frequency band,
wherein the variable capacitor structure comprises coarse tune capacitors and fine tune capacitors,
wherein the coarse tune capacitors comprise four sets of capacitors controlled by respective control bits <3:0>and the fine tune capacitors are controlled by voltages obtained from a filter.

4. The variable controlled oscillator of claim 3, wherein the filter is a differential filter.

5. A variable controlled oscillator comprising a variable capacitor structure having at least one capacitor set driven by a control gate voltage of a voltage control circuit which comprises a logic cell that senses a selected frequency band and sets the control gate voltage based on the selected frequency band, wherein:
the control gate voltage is held at ground (gnd) for frequency bands 0-8 so that capacitance of the at least one capacitor set is at a lowest capacitance; and
the control gate voltage is held at a predetermined voltage above ground for frequency bands 9-15 based on the selected frequency band, thereby increasing the capacitance of the at least one capacitor set.

6. The variable controlled oscillator of claim 5, wherein the control gate voltage is a function of the selected frequency band.

7. The variable controlled oscillator of claim 5, wherein the voltage control circuit includes diode connected field effect transistors (FETs) which create the control gate voltage based on the selected frequency band.

8. The variable controlled oscillator of claim 7, wherein a differential filter voltage is additionally used to create the control gate voltage.

9. The variable controlled oscillator of claim 8, wherein the differential filter voltage varies from 0.1V to 0.9V.

10. The variable controlled oscillator of claim 7, wherein the diode connected FETs comprise six diode connected FETs.

11. The variable controlled oscillator of claim 10, wherein combinations of the six diode connected FETs are selectable based on selected frequency bands 9-15.

12. The variable controlled oscillator of claim 11, wherein the six diode connected FETs are coupled to ground when the selected frequency band is frequency band 15 such that the control gate voltage is at its highest.

13. The variable controlled oscillator of claim 11, wherein for each frequency band 9-15, the logic cell is structured to select certain of the diode connected FETs to be coupled to one of ground and a voltage node, in order to affect the control gate voltage and, hence change frequency in certain bands.

14. The variable controlled oscillator of claim 13, wherein control gate voltage is customized based on the selected frequency band.

15. A variable capacitor structure, comprising:
a first variable capacitor configuration having a binary weighted array of capacitor segments, each of the capacitor segments being enabled by one of a plurality of binary control bits;
a second variable capacitor configuration having a capacitance controlled by a first analog control voltage provided by a phase-locked loop; and
a third variable capacitor configuration having a capacitance controlled by a control voltage set by a logic cell that senses a selected frequency band,
wherein the logic cell is structured to select certain diode connected field effect transistors (FETs) to be coupled to one of a ground and a voltage node, in order to affect the control voltage and, hence change frequency in certain bands.

16. The variable capacitor structure of claim 15, wherein the logic cell sets the control voltage based on the selected frequency band.

17. The variable capacitor structure of claim 16, wherein voltage control circuit comprises the diode connected field effect transistors (FETs) which create the control voltage based on the selected frequency band, in addition to the first analog control voltage.

18. The variable capacitor structure of claim 17, wherein:
for each frequency band 9-15, the logic cell is structured to select certain of the diode connected FETs to be coupled to one of ground and a voltage node, in order to affect the control voltage and, hence change frequency in certain bands.

19. The variable capacitor structure of claim 18, wherein:
all of the diode connected FETs are coupled to ground when the selected frequency band is frequency band 15 such that the control voltage is at its highest; and
none of the diode connected FETs are coupled to ground when the selected frequency band is frequency band 9 such that the control voltage is at its lowest.

20. A method for equalizing gain of a voltage controlled oscillator over a plurality of frequency bands, comprising:
determining a frequency band;
selecting a control voltage based on the determined frequency band; and
setting the control voltage to a variable capacitor by a logic cell,
wherein the logic cell is structured to select certain diode connected field effect transistors (FETs) to be coupled to one of a ground and a voltage node, in order to affect the control voltage and, hence change frequency in certain bands.

* * * * *